(12) United States Patent
Oshino et al.

(10) Patent No.: US 6,909,774 B2
(45) Date of Patent: Jun. 21, 2005

(54) APPARATUS AND METHODS FOR SURFICIAL MILLING OF SELECTED REGIONS ON SURFACES OF MULTILAYER-FILM REFLECTIVE MIRRORS AS USED IN X-RAY OPTICAL SYSTEMS

(75) Inventors: Tetsuya Oshino, Sagamihara (JP); Katsuhiko Murakami, Kanagawa (JP); Hiroyuki Kondo, Kawasaki (JP); Katsumi Sugisaki, Yokohama (JP); Masaki Yamamoto, Sendai (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/241,959

(22) Filed: Sep. 11, 2002

(65) Prior Publication Data
US 2003/0058986 A1 Mar. 27, 2003

(30) Foreign Application Priority Data
Sep. 26, 2001 (JP) ........................................ 2001-292913

(51) Int. Cl.⁷ ................................................ G21K 1/06
(52) U.S. Cl. ........................................................ 378/84
(58) Field of Search .............................. 378/34, 84, 85; 359/586–589, 584, 359, 576, 562

(56) References Cited

U.S. PATENT DOCUMENTS 4,915,463 A * 4/1990 Barbee, Jr. .................. 359/360
5,514,499 A * 5/1996 Iwamatsu et al. .............. 430/5
6,641,959 B2 * 11/2003 Yan ............................. 430/5

OTHER PUBLICATIONS

U.S. Appl. No. 09/684,873, filed Oct. 6, 2000, Murakami et al.
U.S. Appl. No. 10/012,739, filed Oct. 19, 2001, Shiraishi et al.
U.S. Appl. No. 10/229,638, filed Aug. 27, 2002, Kandaka et al.

* cited by examiner

Primary Examiner—Craig E. Church
Assistant Examiner—Jurie Yun
(74) Attorney, Agent, or Firm—Klarquist Sparkman, LLP

(57) ABSTRACT

Apparatus and methods are disclosed for milling selected regions on the surface of a multilayer-film reflective surface of an X-ray mirror to correct the reflected wavefront produced by the mirror, thereby producing a more uniform or otherwise more desirable phase distribution of the reflected wavefront. The milled multilayer films include multiple lamina sets each including respective layers of at least two respective substances. The layers usually are "stacked" alternatingly at a fixed period length on a mirror substrate. By selectively removing one or more surficial layers in selected locations, local corrections of the phase shift of the reflective wavefront are achieved. At each milling location, the depth profile can be stepwise or smoothly gradated. Milling methods can include lapping, ion-beam bombardment, plasma-enhanced chemical vapor machining (CVM), reactive-ion etching, photochemical reactions, or laser ablation.

5 Claims, 7 Drawing Sheets

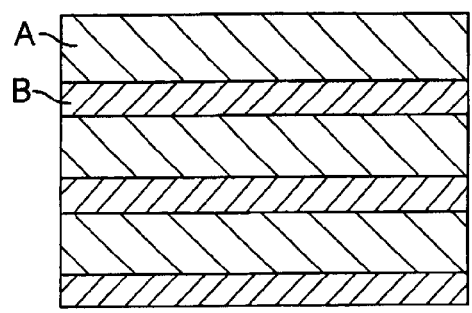
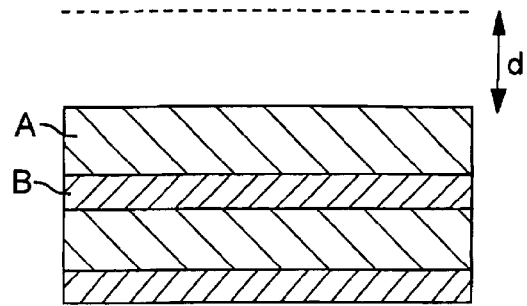
FIG. 8(a)          FIG. 8(b)
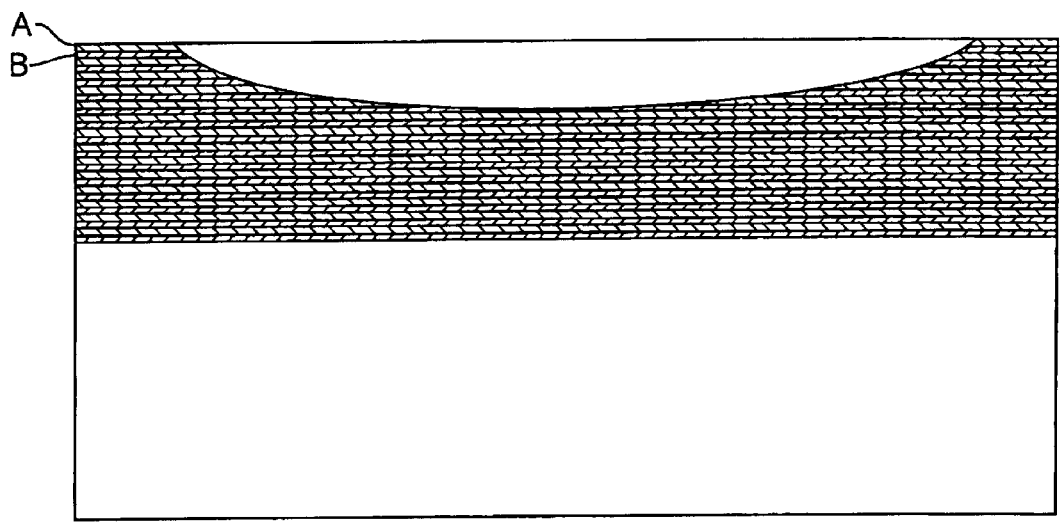
FIG. 8(C)

APPARATUS AND METHODS FOR SURFICIAL MILLING OF SELECTED REGIONS ON SURFACES OF MULTILAYER-FILM REFLECTIVE MIRRORS AS USED IN X-RAY OPTICAL SYSTEMS

FIELD

This invention pertains to microlithography (projection-transfer of a pattern, defined by a reticle or mask, onto a substrate). Microlithography is a key technology used in the manufacture of microelectronic devices such as integrated circuits, displays, and the like. More specifically, this invention pertains to microlithography performed using certain wavelengths of X-radiation as a lithographic energy beam, e.g., X-rays having a wavelength in the range of 1 to 30 nm, and to reflective optical systems used in microlithography apparatus operating in this wavelength range. Even more specifically, the invention pertains to multilayer-film reflective mirrors used in X-ray optical systems for such microlithography apparatus, and to apparatus and methods for producing such mirrors.

BACKGROUND

In recent years in response to the ever-increasing miniaturization and densification of microelectronic circuit elements as used in, for example, semiconductor integrated circuits, microlithography apparatus and methods have been developed that employ a "soft X-ray" (SXR) beam as a lithographic energy beam. SXR microlithography (also termed "extreme ultraviolet" or "EUV" microlithography) offers prospects of achieving better resolution of fine pattern elements than currently obtainable using conventional optical microlithography (i.e., microlithography performed using "vacuum" ultraviolet, or VUV, wavelengths). SXR radiation has a wavelength generally within the range of 11 nm to 14 nm, which is significantly shorter than the wavelength of VUV radiation (about 150 nm or greater). In other words, current optical microlithography technology is compromised by diffraction limits, which prevent obtaining ever greater resolution (e.g., see Tichenor et al., *Proceedings SPIE* 2437:292, 1995). EUV microlithography has been hailed as the "microlithography of the future," capable of achieving resolutions of about 70 nm and smaller, which cannot be achieved using optical microlithography.

With SXR wavelengths, the refractive index of substances is extremely close to unity. As a result, conventional optical elements for achieving refraction and/or reflection of optical wavelengths cannot be used. Instead, grazing-incidence mirrors or multilayer-film mirrors typically are used. Grazing-incidence mirrors achieve total reflection with a refractive index of slightly less than unity, and multilayer-film mirrors achieve a high overall reflectivity by passing weakly reflected light from each layer through multiple phase-matched convolutions. For example, a reflectivity of 67.5% can be obtained of a normal incident beam having a wavelength of about 13.4 nm using a reflective mirror comprising a Mo/Si multilayer film, in which molybdenum (Mo) layers and silicon (Si) layers are laminated in an alternating manner. A reflectivity of 70.2% can be obtained of a directly incident beam having a wavelength of about 11.3 nm using a reflective mirror comprising a Mo/Be multilayer film, in which Mo layers and beryllium (Be) layers are laminated in an alternating manner. For example, see Montcalm, *Proceedings SPIE* 3331:42, 1998.

Conventional SXR microlithography apparatus comprise a SXR source, an illumination-optical system, a reticle stage, an imaging-optical (projection-optical) system, and a substrate stage. The SXR source can be a laser-plasma source, a discharge-plasma source, or a synchrotron-radiation source. The illumination-optical system comprises grazing-incidence mirrors each having a respective reflective surface that reflects SXR radiation that is obliquely incident to the reflective surface, multilayer-film mirrors each having a reflective surface are formed by a multilayer film, and a filter that transmits only SXR radiation of a specified wavelength. Thus, the reticle is illuminated by SXR radiation having a desired wavelength.

Since no known substances are transparent to SXR radiation, the reticle is a so-called "reflective reticle" rather than a conventional transmission-type reticle. The imaging-optical system comprises multiple multilayer-film mirrors, and is configured to form an image, of the irradiated region of the reticle, on the substrate (e.g., semiconductor wafer) to which a layer of a suitable resist has been applied. Thus, the image is transferred to the layer of resist. Since SXR radiation is absorbed and attenuated by the atmosphere, the SXR light path in the microlithography apparatus normally is maintained at a certain vacuum (e.g., $1 \times 10^{-5}$ Torr or less).

As noted above, the imaging-optical system comprises multiple multilayer-film mirrors. Since the reflectivity of a multilayer-film mirror is not 100 percent, the imaging-optical system desirably consists of as few such mirrors as possible to minimize light loss. Thus far, imaging-optical systems comprising four multilayer-film mirrors (e.g., Jewell and Thompson, U.S. Pat. No. 5,315,629; and Jewell, U.S. Pat. No. 5,063,586) and six multilayer-film mirrors (e.g., Williamson, U.S. Pat. No. 5,815,310) have been reported. Unlike refractive optical systems through which a light flux propagates in one direction, reflective optical systems are characterized by the doubling back of the light flux on itself within the optical system. Hence, it is difficult to obtain a large numerical aperture (NA) due to restrictions such as avoiding eclipsing the light flux with the mirrors.

Whereas a NA of no more than about 0.15 can be obtained in a four-mirror imaging-optical system, it is possible for a six-mirror optical system to have an even greater NA. Normally, an even number of mirrors is used in the imaging-optical system so that the reticle stage and the substrate stage can be situated on opposite sides of the optical system. Since the imaging-optical system must correct aberrations using a limited number of surfaces, each of the mirrors typically has an aspherical profile, and a ring-field imaging scheme is used in which aberrations are corrected only in the proximity of a desired lateral displacement from the optical axis. To transfer the entire reticle pattern onto the substrate, exposure is performed while scanning the reticle stage and the substrate stage at respective velocities that differ from each other according to the magnification ratio of the imaging-optical system.

Imaging-optical systems, as discussed above, for use in SXR microlithography apparatus are so-called "diffraction-limited" optical systems. These optical systems cannot achieve the performance levels for which they were designed unless wavefront aberrations can be minimized adequately. A guideline for tolerances of wavefront aberration in a diffraction-limited optical system is Marechal's standard, in which the root-mean-square (RMS) departure of the wavefront from a reference sphere that is centered on the diffraction focus does not exceed $\lambda/14$, wherein $\lambda$ is wavelength. Born and Wolf, *Principles of Optics*, 7$^{th}$ edition, Cambridge University Press, 1999, p. 528. These are the conditions for obtaining 80% or more of the Strehl intensity (the ratio of maximum point-image intensities in an optical system with aberrations to maximum point-image intensities in an optical system with no aberrations). Imaging-optical systems in actual SXR microlithography apparatus are configured to produce aberrations even lower than this.

In the SXR microlithography techniques currently under vigorous research and development, exposure "light" is used having a wavelength primarily in the range of 13 nm to 11 nm. With respect to wavefront error (WFE) in an optical system, the form error (FE) allowed for each individual mirror is given by Equation (1):

$$FE = (WFE)/2/m^{1/2} \, (RMS) \qquad (1)$$

In Equation (1), "m" is the number of mirrors that make up the optical system, and WFE is divided by two because wavefront error is double the form error. This is because both incident light and reflected light in a reflective optical system are subject to the effects of each respective form error.

The form error (FE) allowed for each individual mirror in a diffraction-limited optical system is given by Equation (2), relative to wavelength λ and number of mirrors m:

$$FE = \lambda/28/m^{1/2} \, (RMS) \qquad (2)$$

In the case of a 4-mirror imaging-optical system, this value is 0.23 nm (RMS) at a wavelength of 13 nm and 0.20 nm (RMS) at a wavelength of 11 nm. In the case of an optical system comprising 6 mirrors, this value is 0.19 nm (RMS) at a wavelength of 13 nm and 0.16 nm (RMS) at a wavelength of 11 nm.

Unfortunately, a high-precision aspherical mirror satisfying the foregoing criteria is extremely difficult to manufacture. This is the main reason why a practical SXR microlithography apparatus has not been realized yet. The fabrication accuracy achievable to date for an aspherical mirror is about 0.4 to 0.5 nm (RMS). Gwyn, *Extreme Ultraviolet Lithography White Paper*, EUV LLC, p. 17, 1998. Consequently, fabrication and design techniques for aspherical surfaces used in mirrors in imaging optical systems must be improved substantially in order to achieve a practical SXR microlithography apparatus that exhibits higher resolution than obtainable with current optical lithography.

Producing acceptable multilayer-film mirrors requires: (a) an ability to form an acceptable aspherical surface on a mirror substrate, (b) an ability to form a multilayer-film coating on the reflective surface of the mirror, and (c) an ability to perform minute corrections to the surface of the multilayer film as required. With respect to the latter, breakthrough technology recently was reported by Yamamoto who disclosed a method by which sub-nanometer form errors were correctable by etching away the surface of a multilayer-coated mirror one layer at a time (Yamamoto, *7th International Conference on Synchrotron Radiation Instrumentation*, Berlin, Germany, Aug. 21–25, 2000, POS2-189). The principles of this method are explained with reference to FIGS. 8(a)–8(c).

FIG. 8(a) depicts a region of a multilayer-film surface consisting of three "layer sets" or "lamina sets." Each lamina set consists of a layer of substance A and a layer of substance B and has a thickness ("period length") denoted by "d". Note that the layers are formed alternatingly. FIG. 8(b) depicts the region of FIG. 8(a), but with one lamina set removed from the surface of the multilayer film. In FIG. 8(a), the optical path length for one lamina set of thickness d, relative to a light beam incident perpendicularly to the surface of the multilayer film, is expressed by $OP = n_A d_A + n_B d_B$, wherein $d_A$ and $d_B$ represent the thicknesses of the respective layers, and $d_A + d_B = d$. The refractive indices of the substances A, B are denoted by $n_A$ and $n_B$, respectively.

In FIG. 8(b), the optical path length of the portion, having thickness d, from which the topmost lamina set has been removed is expressed by $OP' = n_o d$, wherein $n_o$ represents the refractive index of a vacuum, and $n_o = 1$. Thus, by removing the topmost lamina set of the multilayer film, the optical distance through which an incident beam must propagate is changed. This is optically equivalent to correcting the surface shape by the magnitude of the change in the optical path length.

The change in optical path length (i.e., change in surface shape) is expressed by $\Delta = OP' - OP$. Since the refractive index of a substance is near unity (1) in the SXR wavelength band, Δ is very small, which facilitates precision corrections of the surface profile of a multilayer-film mirror using this method. For example, consider a case in which a Mo/Si multilayer-film mirror is used at a wavelength of 13.4 nm. At perpendicular incidence, d=6.8 nm, $d_{Mo}$=2.3 nm, and $d_{Si}$=4.5 nm. The refractive indices at this wavelength are $n_{Mo}$=0.92 and $n_{Si}$=0.998. Calculating the change in optical path length using these figures yields OP=6.6 nm, OP'=6.8 nm, and Δ=0.2 nm. Thus, a surface-shape correction equivalent to 0.2 nm can be accomplished by processing the surface of the multilayer film sufficiently to remove a 6.8 nm-thick lamina set.

Since the refractive index of the Si layer is near unity (1), any change in the optical path length of a Mo/Si multilayer-film mirror achieved by removing one lamina set results primarily from the removal of the Mo layer. In other words, the presence or absence of the respective Si layer has virtually no effect. Consequently, when removing a surficial lamina set from a multilayer-film mirror, there is no need to control the thickness of the respective Si layer accurately. In this example, the Si layer was 4.5 nm thick; layer-removal processing could have been stopped in the middle of the Si layer. In other words, surface-profile correction can be performed in 0.2 nm units by performing local "milling" of the multilayer-film surface at a precision of several nm.

In the implementation of this surface-profile-correction method, after fabricating a multilayer-film mirror, the reflected wavefront produced by the mirror is measured and evaluated. Based on the results of the measurements, a predetermined amount of milling of selected loci on the surface is performed to remove one or more lamina sets as required to make identified corrections in the reflected wavefront.

The index of reflection of a multilayer-film mirror increases with corresponding increases in the number of lamina sets. This trend is applicable up to a threshold number of lamina sets, beyond which the reflectivity is saturated and remains constant as additional lamina sets are added. If the mirror is formed initially with a number of lamina sets sufficient to achieve a saturated index of reflection, the mirror will not exhibit any change in the index of reflection if subjected to local surficial milling of one or a few lamina sets.

Surficial milling of the mirror surface must be performed at high accuracy and precision. I.e., a milling apparatus must be able to control the amount of multilayer film removed from the selected loci with a high degree of accuracy and precision in order to achieve the desired correction. Exemplary conventional methods for removing surficial lamina sets are wet-etching methods using acid or alkaline solution or "sandblasting" methods using, e.g., metal or ceramic dust. Unfortunately, it is very difficult with any of these methods to achieve a desired level of control over the amount of material actually removed. In addition, removal of multiple lamina sets from a location on the surface of the multilayer film should be performed in a manner yielding a gradation of number of lamina sets actually removed, as shown in FIG. 8(c), to ensure smooth corrections to reflective wavefront errors. This is because the amount of phase shift to be corrected changes with the amount of the multilayer film actually removed, and the amount of phase shift to be corrected differs across the surface of the multilayer-film mirror. Since the amount of milling to be implemented for this correction is from a few nm to several tens of nm, the distribution of the amount actually milled must be achieved with very high accuracy and precision.

SUMMARY

In view of the shortcomings of conventional methods as summarized above, the present invention provides, inter alia, multilayer-film-milling devices and methods with which one or more surficial layers of a multilayer film on a multilayer-film mirror can be removed from a selected location with high accuracy and precision, while also providing a desired gradation, distribution, or profile of layer removal in the vicinity of the location. The invention also provides multilayer-film mirrors of which the surface has been milled locally as required with high accuracy and precision so as to impart needed corrections to the reflection wavefront produced by the mirror.

According to a first aspect of the invention, devices are provided for milling a surface of a multilayer film on a multilayer-film reflective mirror. The subject multilayer film comprises multiple lamina sets formed at a specified period length on a mirror substrate. Each lamina set consists of alternating respective layers of at least two substances having different refractive indices to a wavelength of light to be reflected from the mirror. An embodiment of such a device comprises a milling tool configured to remove one or more layers of the multilayer film at a selected location on the surface of the multilayer film so as to correct a phase shift in a wavefront of the light reflected from the multilayer-film mirror.

The device further can comprise a stage for holding the multilayer-film mirror relative to the milling tool. The stage can be configured to move the multilayer-film mirror in at least an X-Y or X-θ plane relative to the milling tool.

In the device, the milling tool can be configured to remove one or more surficial lamina sets from the selected location in a manner yielding a desired depth profile of removed layers, or in a manner yielding a desired lateral profile of removed layers.

The milling tool can have any of various configurations, including but not limited to, a lapping tool, an ion-beam-milling tool, a plasma-enhanced chemical-vapor-machining (CVM) tool, a reactive-ion-etching (RIE) tool, a localized-chemical-reaction tool, or a laser-ablation tool.

The lapping tool can comprise a lapping pad having a width smaller than a width dimension of the multilayer film, a movement mechanism configured to move at least one of the multilayer-film mirror and the lapping tool relative to each other, and a controller connected to the lapping tool and the movement mechanism. The controller is configured to control actuation of at least one of the lapping tool and the movement mechanism.

The device can include multiple lapping tools, one for application to each layer of a respective material. In such a configuration, each lapping tool can be independently movable relative to the multilayer-film mirror. This embodiment further can comprise a controller connected to the multiple lapping tools and configured to select a particular lapping tool to contact the multilayer film at the selected location, based on the particular layer material to be milled at the location.

Device embodiments in which the milling tool is a lapping tool can include a lapping-liquid dispenser situated relative to the lapping tool so as to dispense lapping liquid at the selected location whenever the lapping tool is removing material from the selected location.

In embodiments in which the milling tool is an ion-beam milling tool, the ion-beam milling tool can include an ion source situated and configured to irradiate the selected location with a beam of ions, a movement mechanism configured to move at least one of the multilayer-film mirror and the ion source relative to each other, and a controller connected to the ion source and the movement mechanism. The controller is configured to control actuation of at least one of the ion source and the movement mechanism. This device further can include a mask member situated between the ion source and the surface of the multilayer film. The mask member defines an opening serving to limit lateral spread of the ion beam as incident on the selected location on the surface of the multilayer film. Alternatively or in addition, the device further can include a beam-adjustment mechanism configured to impart a preselected ion-density distribution to the beam as irradiated at the selected location on the surface of the multilayer film. The beam-adjustment mechanism can include an electrostatic or electromagnetic lens element situated upstream of the multilayer-film mirror and configured to change a diameter of the beam as incident on the multilayer-film surface.

In other embodiments the ion source produces a focused ion beam as incident on the selected location on the surface of the multilayer film. These devices further can include a gas supply connected to the ion source, wherein the gas supply is configured to deliver a flow of ionizable gas to the ion source such that the ion source produces a beam of ions of the gas and directs the beam toward the surface of the multilayer film. The gas can be, for example, argon, xenon, or krypton.

In device embodiments in which the milling tool is a plasma-enhanced CVM tool, the plasma-enhanced CVM tool can comprises a plasma-generation source configured to generate a plasma and to cause the plasma to be situated adjacent the selected location on the surface of the multi-layer film. The tool also can include a movement mechanism configured to move at least one of the multilayer-film mirror and the plasma-generation source relative to each other, and a controller connected to the plasma-generation source and the movement mechanism. The controller is configured to control actuation of at least one of the plasma-generation source and the movement mechanism. The devices further can comprise a gas supply situated and configured to deliver a stream of gas to the plasma adjacent the selected location. The gas desirably is formulated to generate, in the plasma, free radicals that react with the surface of the multilayer film at the selected location.

According to another aspect of the invention, methods are provided for milling a surface of a multilayer film on a multilayer-film reflective mirror so as to correct a phase shift in a reflected wavefront from the multilayer-film mirror. As noted above, the multilayer film comprises multiple lamina sets formed at a specified period length on a mirror substrate. Each lamina set consists of alternating respective layers of at least two substances having different refractive indices to a wavelength of light to be reflected from the mirror. In an embodiment of the subject methods, a "layer-material-milling force" is directed at the selected location on the surface of the multilayer film so as to remove at least one layer from the selected location. While removing the at least one layer at the selected location, a desired distribution in the amount of material removed at the location is provided.

The step of providing a desired distribution can comprise providing a desired depth distribution, which can be stepwise or smoothly contoured. Alternatively or in addition, the step of providing a desired distribution can comprise providing a desired lateral distribution.

The step of directing a layer-material-milling force can comprise selecting at least one parameter of the layer-material-milling force according to the layer material being milled at the selected location on the surface of the multilayer film.

The method can include the step of producing the layer-material-milling force. The produced layer-material-milling force can be, but is not limited to, lapping, ion-beam machining, plasma-enhanced CVM, RIE etching, localized chemical reaction, or laser ablation.

The step of directing a layer-material-milling force can comprise selecting a respective layer-material-milling force according to the layer material being milled at the selected location on the surface of the multilayer film. Alternatively or in addition, the step of directing a layer-material-milling force can comprise disposing a mask member on or near the selected location on the surface of the multilayer film to limit the removal one or more layers at the selected location. In this latter instance, the step of disposing the mask member can comprise applying a patterned resist to at least a portion of the surface of the multilayer film including the selected location. The resist can be applied and patterned by microlithography, for example. The method further can comprise the step of milling a portion of the multilayer film at the selected location using the resist pattern as a mask. The method further can comprise the steps of: (a) removing the mask, (b) applying a new resist, (c) patterning the new resist, and (d) milling a portion of the multilayer film at the selected location using the newly patterned resist as a mask so as mill the selected location according to a desired profile. The desired profile can be a depth profile (e.g., stepwise or smoothly contoured).

The step of directing a layer-material-milling force can comprise applying a resist to the surface of the multilayer film, patterning the resist so as to define in the resist a thickness distribution of layers at the selected location on the surface of the multilayer film, and milling the surface of the multilayer film at the selected location according to the resist pattern. In this embodiment, the resist can be patterned microlithographically by directing an exposure light flux at the resist. More specifically, the resist can be patterned by irradiation with the exposure light flux configured to have a desired light-intensity distribution corresponding to the thickness distribution. For example, the exposure light flux can be configured by light interference to have the desired light-intensity distribution.

According to yet another aspect of the invention, multilayer-film mirrors are provided. An embodiment of such a mirror comprises a mirror substrate and a multilayer film formed on a surface of the mirror substrate by alternatingly laminating multiple layers of at least two types of substances having different respective refractive indices. The layers are grouped into lamina sets having a specified period length. The multilayer film includes a removed portion at a selected location at which at least one lamina set is removed to correct a phase shift in a reflected wavefront from the multilayer film. The removed portion has a predetermined distribution with respect to amount of layer material removed.

Also within the scope of the invention are X-ray optical systems that comprise at least one multilayer-film mirror as summarized above, and X-ray exposure apparatus that comprise such an X-ray optical system. The X-ray exposure apparatus can include an X-ray source that generates an X-ray beam, and an illumination-optical system that guides the X-ray beam from the X-ray source to a reticle that defines a pattern. The apparatus also can include a projection-optical system that guides the X-ray beam from the reticle to a lithographic substrate coated with a resist, so as to transfer the pattern from the reticle to the substrate. The at least one multilayer-film mirror can be situated, for example, in at least one of the illumination-optical system, the projection-optical system, and the reticle.

The foregoing and additional features and advantages of the invention will be more readily apparent from the following detailed description, which proceeds with reference to the accompanying drawings.

BRIEF DESCRIPTION OF THE DRAWINGS

FIGS. 8(a)–8(b) are respective schematic elevational sections showing removal of one lamina set of layers from a region on a multilayer-film surface.

FIG. 8(c) is a schematic elevational section of a portion of a multilayer film from which multiple lamina sets have been removed in a manner yielding a smoothly contoured depth profile.

DETAILED DESCRIPTION

General Considerations

Figure 1:
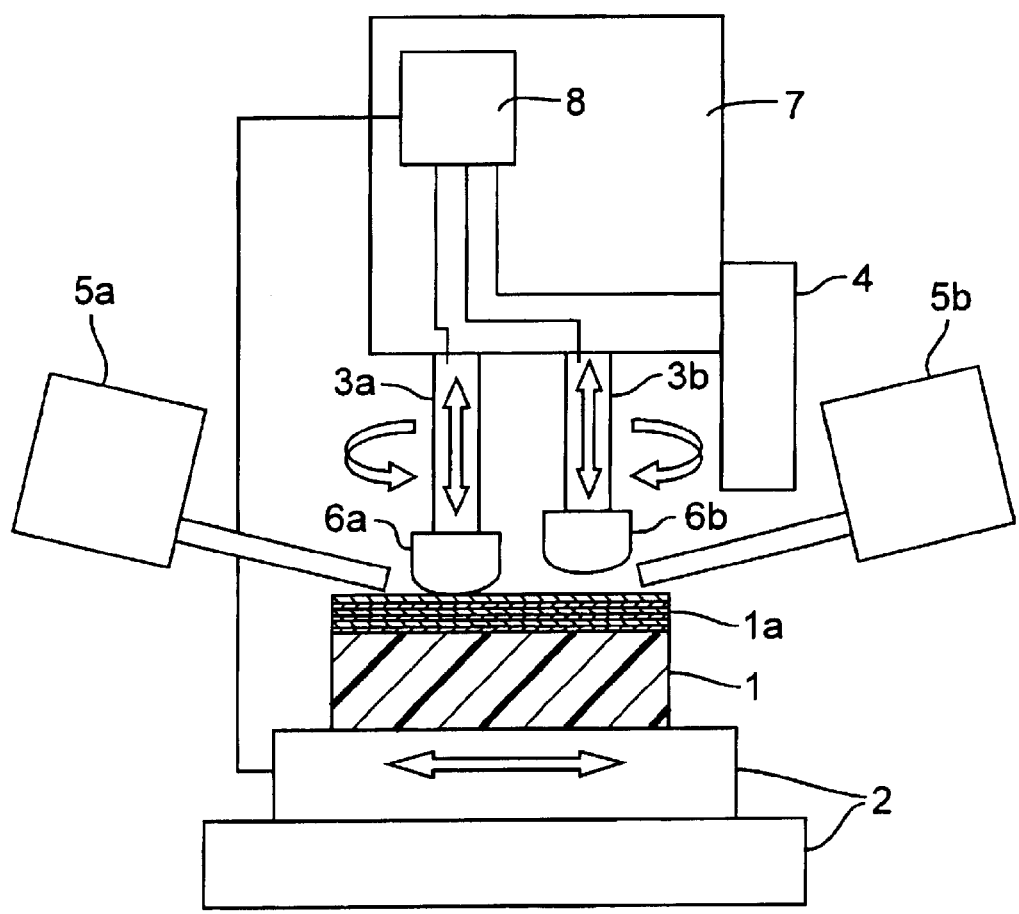
FIG. 1 is a schematic elevational diagram of a multilayer-film-milling device according to a first representative embodiment.

Multilayer-film-milling devices within the scope of the invention include, but are not limited to, devices that locally remove surficial layer(s) by lapping, ion-beam bombardment, plasma-enhanced chemical vapor machining (CVM), reactive-ion etching, photochemical reactions, or laser ablation. Each of these techniques is an exemplary manner by which a "layer-material-milling force" is applied to a selected location on the surface of the multilayer film. Devices employing lapping grind away layer(s) by local application of an abrasive using, e.g., an abrasive tool equipped with a distal abrasive pad. Devices employing ion-beam bombardment remove layer(s) by bombardment with ions produced by an ion source or the like. Devices employing plasma-enhanced CVM or reactive-ion etching remove layer(s) by reaction with plasma radicals produced at an electrode tip or between electrodes. Devices employing photochemical reaction remove layer(s) by direct irradiation of a gas in an atmosphere of the gas, which produces a local supply of reactive gas by photo-excitation. Devices employing laser ablation remove layer(s) by directing high-power laser radiation to the surface, which ablates the surface. Concrete descriptions of each of these devices and methods are provided below. In general, any of these devices and methods is capable of locally removing one or more surficial layers of a multilayer film, with accurate and precise control of the amount of material actually removed. Typically, the amount of material removed can be controlled at an accuracy of less than a single layer thickness.

In addition, the subject multilayer-film milling devices include means for achieving a desired gradation or spatial distribution of material actually removed in the vicinity of the milling location on the surface of the multilayer film. Thus, the distribution of the amount of layer material actually removed is controlled precisely. For example, the lapping device utilizes a small milling tool, the ion-beam device uses a focused ion beam, the CVM device produces a constricted plasma, and the laser-ablation and photochemical-reaction devices use a laser beam having a beam diameter that is smaller than the diameter or other width dimension of the mirror surface. Thus, it is possible to remove only a portion of the thickness of a layer. Furthermore, by moving the work piece relative to the milling "tool" during milling, any desired location on the multilayer-film surface is milled, thereby facilitating achievement of the desired distribution of the amount of material actually removed.

In other examples, in the ion-beam-milling device, the irradiation dose of the ion beam is provided with an intensity distribution. In the reactive-ion-etching device, etching work can be performed after forming a desired patterned-resist layer on the surface of the multilayer film. In the photochemical-reaction and laser-ablation devices, the dose of the irradiating laser light can be provided with an intensity distribution. These distributions facilitate achievement of the desired spatial distribution or gradation of the amount of material actually removed.

During surficial milling of a multilayer film, actual milling is performed in a manner by which the bulk of the multilayer film remains intact to serve its intended role in reflecting incident X-radiation. I.e., milling is performed in a manner ensuring that the basic reflective function of the remaining multilayer film is retained. Since multilayer films generally are not resistant to heat, it is necessary to prevent the mirror from experiencing a significant temperature increase during milling. For example, the milling device can include a means for cooling the multilayer-film mirror during milling, wherein the means shunts away from the mirror any heat produced by milling. Also, certain milling techniques can cause collateral deterioration of the multilayer film. For example, when performing milling by lapping, it is desirable not to exert more pressure on the multilayer film than necessary. When milling using an ion beam or the like, it is desirable that milling be performed under conditions that prevent implantation of ions in the interior of the multilayer film.

Since each lamina set of a multilayer film comprises at least two types of layers (e.g., a multilayer film comprising alternating layers of Mo and Si for reflecting SXR radiation having a wavelength of about 13 nm), the milling device desirably is capable of milling any of the types of layers. Higher precision milling is possible by selecting optimal milling parameters for each of the different types of layers and performing milling under different respective conditions for each of the layers.

There are situations in which milling cannot be performed for each of the multiple layers of a multilayer film using the same milling device. In such an instance, milling may be performed using multiple milling devices. For instance, consider a case in which each lamina set of a multilayer film comprises a respective layer A and a respective layer B. If the milling device $D_A$ is better suited for milling layer A and the milling device $D_B$ is better suited for milling layer B, then layers A and B may be milled by shifting the mirror as required to the two devices $D_A$, $D_B$ in alternating manner, depending upon which layer is being milled. High-throughput milling can be achieved by employing a robotic device for transporting the multilayer-film mirror between the two devices.

The invention is described further below in the context of multiple representative embodiments that are not intended to be limiting in any way. The following representative embodiments are described, by way of example, in the context of milling performed on a multilayer-film mirror in which each lamina set consists of a respective Si layer and a respective Mo layer. It will be understood that the multilayer-film mirror can be made of any of various layer materials.

In addition, it will be understood that "light," as generally used herein in the context of reflection from a multilayer-film mirror, is not limited to visible wavelengths of electromagnetic radiation. Usually, in view of the particular configuration and application of the subject multilayer-film mirrors, "light" in terms of reflection from such a multilayer-film mirror refers to X-ray light, including the so-called SXR wavelengths.

First Representative Embodiment

FIG. 1 schematically depicts a multilayer-film-milling device according to a first representative embodiment. The depicted device comprises a stage 2 on which a multilayer-film mirror 1 is mounted for milling (with the multilayer film 1a oriented upward in the figure). The device includes one or more lapping tools 3a, 3b and respective lapping-fluid dispensers 5a, 5b. The lapping tools 3a, 3b terminate with respective lapping pads 6a, 6b that are movable relative to a housing or frame 7. The device desirably includes a mirror-position detector 4 that detects the position of the multilayer-film mirror in at least the X and Y directions.

The lapping tools 3a, 3b include respective distally mounted lapping pads 6a, 6b that can have a sponge-like characteristic suitable for holding lapping fluid and for gently applying polishing pressure against the multilayer film 1a. Each lapping pad 6a, 6b is smaller than the diameter (or other width dimension) of the surface of the multilayer film 1a. During lapping, a selected lapping pad 6a, 6b is lowered (see vertical arrows) toward the multilayer film 1a and urged into gentle contact with the surface of the multilayer film 1*a*. As the pad contacts the surface, the pad is rotated (elliptical arrows). Thus, the device desirably comprises means for rotating the lapping pads 6*a*, 6*b* and means for moving the lapping pads toward and away from the multilayer-film surface 1*a*. For example, these means can comprise respective electrical motors that are controlled by a controller 8. As a selected lapping pad 6*a*, 6*b* is brought into contact with the surface of the multilayer film 1*a*, lapping fluid is dispensed from the respective dispenser 5*a*, 5*b* onto the respective location on the surface contacted by the respective pad. Meanwhile, the position of the multilayer-film mirror 1 is detected by the mirror-position detector 4. As a pad 6*a*, 6*b* rotates relative to the multilayer-film mirror 1, the desired location on the surface of the multilayer film 1*a* is lapped.

The amount of film material actually removed is a function of lapping parameters such as the material of which the lapping pads 6*a*, 6*b* are made, the material composition, concentration, and viscosity of the lapping fluid, the pressure with which the lapping pads 6*a*, 6*b* are urged against the surface of the multilayer film 1*a*, the rotational velocity of the lapping pads 6*a*, 6*b*, and the like. Consequently, respective values of these parameters are selected so that the amount of material removed from the surface can be controlled accurately and precisely for each type of layer in the multilayer film 1*a*. Note that, in FIG. 1, two lapping tools 3*a*, 3*b* are provided. One lapping tool can be used for lapping Mo layers and the other lapping tool can be used for lapping Si layers of the multilayer film 1*a*. For example, the lapping tool 3*a* can be used to grind Mo layers, and the lapping tool 3*b* can be used to grind Si layers.

The lapping tools 3*a*, 3*b* desirably are set up so that respective lapping parameters are optimized for the respective types of layer material to be lapped. Thus, for example, the lapping pads 6*a*, 6*b* (and respective lapping fluids used therewith) can be made of different respective materials that are optimal for the respective layer material. Other milling parameters that can be optimized include, for example, respective rotational velocities of the lapping pads 6*a*, 6*b* and respective forces with which the lapping pads 6*a*, 6*b* are urged against the surface of the multilayer film 1*a*. It also is desirable that the respective lapping parameters be selected so as to cause substantially no collateral damage to the multilayer film 1*a* during lapping.

The stage 2 desirably is configured to undergo at least orthogonal motion in the X and Y directions (e.g., the stage is either an X-Y stage or an X-θ stage movable in the X-Y or X-θ planes, respectively). Such movability of the stage 2 ensures that the lapping pads 6*a*, 6*b* can contact any desired location on the surface of the multilayer-film mirror 1. The position of the mirror 1, mounted to the stage 2, is detected by the position detector 4, desirably in real time. By way of example, the position detector 4 comprises a microscope used to detect a reference mark disposed in advance on the surface of the multilayer film 1*a*. Alternatively, the position detector 4 can be incorporated into the actuator that moves the stage 2. For example, the position detector 4 can comprise linear and/or rotary encoders coupled to respective electrical motors used to drive the stage 2 in the X and Y directions or X and θ directions. Further alternatively, the position detector 4 can comprise at least one laser interferometer that detects the position of the stage 2 in a manner similar to the manner an interferometric position detector determines the position of a reticle stage or substrate stage in a microlithography apparatus. In any event, the position detector 4 desirably routes mirror-position data to the controller 8. The controller 8, in turn, controls actuation of the stage 2 based on this feed-back data, thereby achieving accurate and precise control of the loci at which lapping is performed and of the amount of material removed at each selected location.

During an exemplary lapping operation performed at a selected location on the surface of the multilayer film 1*a*, first the topmost silicon layer is ground using the lapping tool 3*b*. After lapping has progressed through the thickness of the topmost Si layer, then the lapping tool 3*a* is positioned at the selected location for grinding the underlying Mo layer. This alternating scheme is repeated as required for removing the desired number of lamina sets from the selected location.

This embodiment has a demonstrable ability to mill a Mo/Si multilayer-film 1 to an accuracy of approximately 1 nm. After milling, the subject mirror exhibited an index of reflectivity that was substantially unchanged from the index measured before commencing milling.

Second Representative Embodiment

Figure 2:
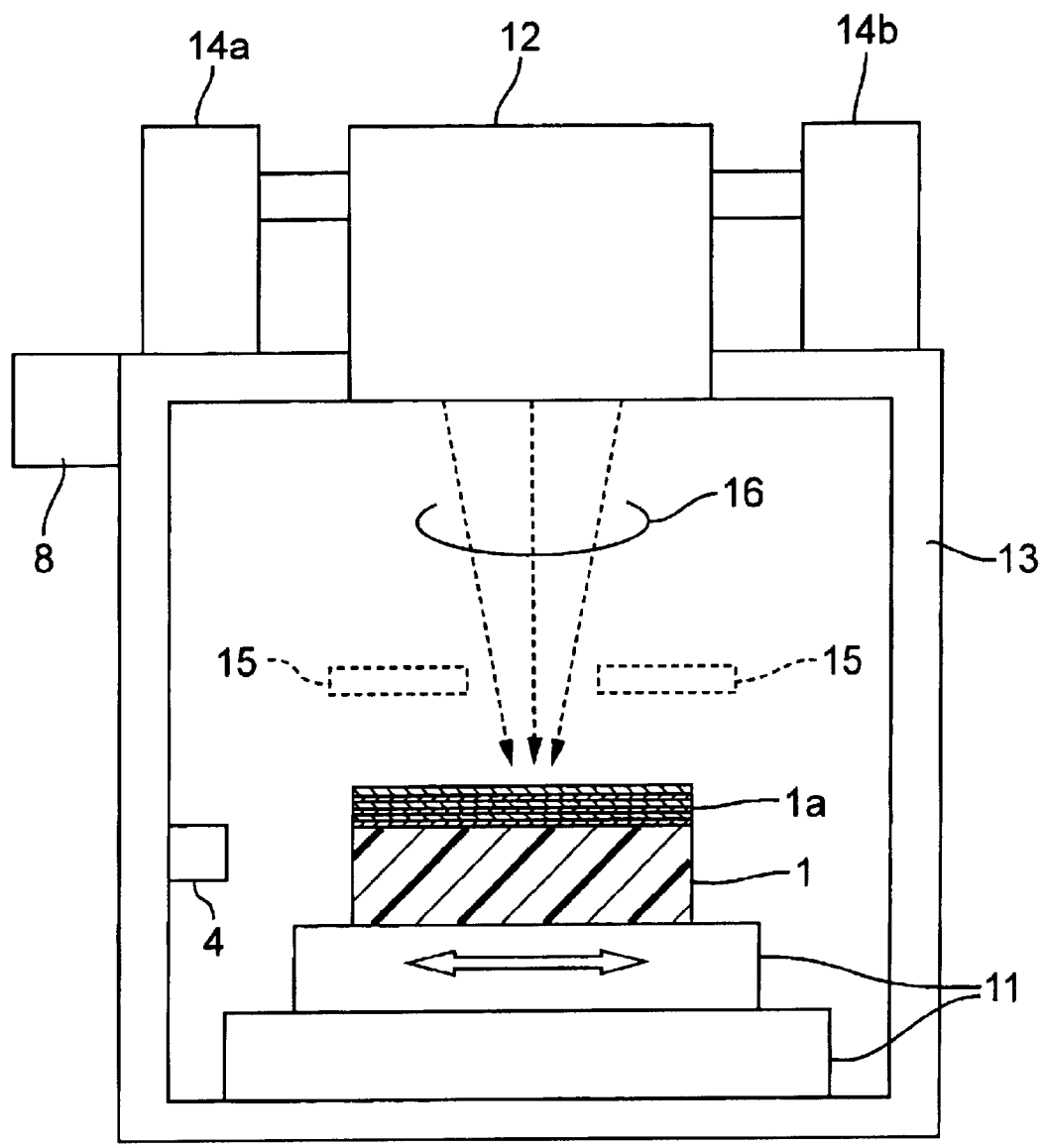
FIG. 2 is a schematic elevational diagram of a multilayer-film-milling device according to a second representative embodiment.

FIG. 2 schematically depicts a multilayer-film-milling device according to a second representative embodiment. In FIG. 2, components that are similar to respective components shown in FIG. 1 have the same respective reference numerals. The depicted device comprises a stage 11 on which the subject multilayer-film mirror 1 is mounted for milling. The device also comprises an ion source 12 that generates a beam 16 of ions to be irradiated onto the surface of the multilayer film 1*a*, a vacuum chamber 13, gas-supplies 14*a*, 14*b*, and a position detector 4 that detects the position of the multilayer-film mirror 1.

The multilayer-film mirror 1 is disposed inside the vacuum chamber 13 in an environment where the mirror can be irradiated with the beam 16 of high-energy ions. Gas is supplied from the gas supplies 14*a*, 14*b* into the ion source 12. The resulting ions produced from molecules of the respective gases are accelerated by a voltage applied across an electrode grid (not shown) inside the ion source and irradiated onto the surface of the multilayer film 1*a*. Desirably, the grid is curved so that ions of the beam 16 are focused by the curved grid onto the selected location on the surface of the multilayer film 1*a*. Impingement of the high-energy ions causes removal of layer material at the location.

The amount of layer material actually removed is a function of the beam-acceleration voltage and/or the beam current, the type(s) of gases supplied to the ion source 12, the respective flow rates of the gas(es), the vacuum level established inside the vacuum chamber 13, the distance from the ion source 12 to the surface of the multilayer film 1*a*, and the angle of incidence of the ions 16 on the surface of the multilayer film 1*a*. Thus, the operating parameters of the ion source 12 have a substantial influence on milling occurring on the surface of the multilayer film 1*a*. Consequently, the ion-source parameters are selected and controlled so as to achieve precise and accurate control of the amount of layer material removed. Since optimal milling conditions differ for, e.g., a Mo layer versus a Si layer, appropriate control of the ion source allows each type of layer to be processed optimally.

For example, for milling a Mo/Si multilayer film, two gas supplies 14*a*, 14*b* are provided so that the Mo layers and Si layers can be processed using different respective gases. Gas is supplied from a first gas supply 14*a* whenever a Mo layer is being milled, and gas is supplied from a second gas supply 14*b* whenever a Si layer is being milled. The gas supplies 14*a*, 14*b* provide different respective gases. Further by way of example, a suitable gas for milling Mo is xenon (Xe), and a suitable gas for milling Si is krypton (Kr). By selecting the gas based on the type of layer to be milled, substantially no collateral damage is caused to the multilayer film 1a as a selected location on a particular layer is being milled. Other gases can be used for milling other layer materials.

The stage 11 desirably is configured to provide orthogonal movement and positioning of the multilayer-film mirror 1 mounted thereto. Thus, the stage 11 can be configured as an X-Y stage or X-θ stage. The stage 11 is drivable in a vacuum environment inside the vacuum chamber 13 in a manner allowing any selected location on the surface of the multilayer film 1a to be positioned relative to the ion beam 16 for milling purposes. Actuation of the stage 11 is controlled by a controller 8, thereby facilitating precise and accurate control of the amount of layer material removed at each selected location on the surface of the multilayer film 1a. Alternatively or in addition to a mechanism employed for actuating movement of the stage 11, a separate mechanism can be included for actuating movement of the ion source 12. A position detector 4 detects the position of the multilayer-film mirror 1, as in the first representative embodiment.

Further with respect to the exemplary Mo/Si multilayer-film mirror 1, when milling a selected location on the surface of the multilayer film 1a, first the topmost Si layer is milled under respective optimal milling conditions. When milling has progressed to the underlying first Mo layer, milling of the Mo layer is performed under respective optimal milling conditions for Mo, which may be different than the optimal milling conditions for Si. This alternating scheme is repeated as required as milling progresses to additional layers beneath the first Si and Mo layers.

The surface area of the multilayer film 1a actually removed, while the stage 11 is stationary, can be selected by adjusting the curvature of the grid or by changing the distance between the ion source 12 and the surface of the multilayer film 1a. In view of the usual complexity of loci at which milling usually is required, the area being milled at any instant desirably is relatively small, requiring that grid curvature and/or source-to-surface distance be selected appropriately.

Especially whenever the location being milled is relatively narrow, it is desirable to place a mask member 15 appropriately relative to and near the surface of the multilayer film 1a. The mask member 15 prevents propagation of extraneous ions to the surface of the multilayer film 1a. Alternatively or in addition, a means (e.g., electrostatic or electromagnetic lens) can be placed between the ion source and the mirror 1 to bend and/or deflect the trajectory path of the ion beam and/or focus the beam on the surface of the multilayer film 1a. This scheme is similar to that used in focused-ion-beam (FIB) apparatus.

Actual results obtained during milling of a Mo/Si multilayer-film mirror using this embodiment revealed a milling accuracy of approximately 0.5 nm. A measurement of index of reflectivity of the multilayer-film mirror performed before and after milling revealed that substantially no change occurred to the index after milling compared to before commencing milling.

Third Representative Embodiment

Figure 3:
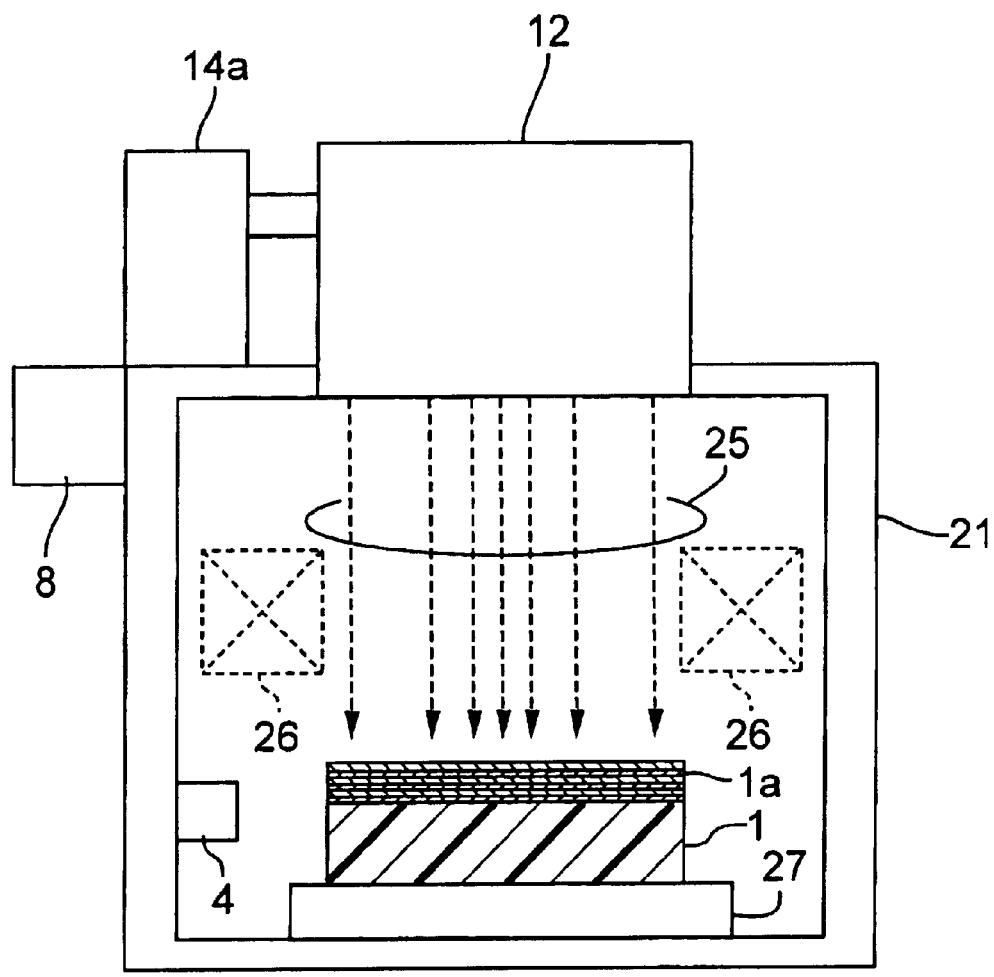
FIG. 3 is a schematic elevational diagram of a multilayer-film-milling device according to a third representative embodiment.

FIG. 3 schematically depicts a multilayer-film-milling device according to a third representative embodiment. In FIG. 3, components that are similar to respective components shown in FIG. 1 have the same respective reference numerals. The depicted device comprises a vacuum chamber 21 inside which a multilayer-film mirror 1 is placed for processing. The vacuum chamber 21 is evacuated to a suitable vacuum. The device also comprises an ion source 12 that generates a beam of ions 25 directed for irradiation onto the surface of the multilayer film 1a. The device also includes a gas supply 14a, and a position detector 4 situated and configured to detect the position of the multilayer-film mirror 1. The device also includes a controller 8.

For milling, the multilayer-film mirror 1 is placed inside the vacuum chamber 21 in a vacuum environment suitable for irradiation of the mirror with a beam 25 of high-energy ions. To produce the ion beam 25, gas is supplied from the gas supply 14a into the ion source 12. Ions of the gas produced in the ion source 12 are accelerated by impressing a voltage on an electrode grid (not shown) located inside the ion source 12. The resulting ion beam 25 is irradiated onto the surface of the multilayer film 1a. The device also is configured to provide, in the beam 25, a desired spatial distribution of ions suitable for forming a distribution of amount of material removed from the vicinity of the target location. The spatial distribution of ions in the beam 25 is produced by, e.g., selecting the shape, size, and distribution of multiple apertures defined in an aperture plate or grid (not shown) through which the ions pass as they propagate from the source 12 to the mirror 1. The ion distribution alternatively may be established and controlled by an electrical field generated by a coil 26 or the like situated between the ion source 12 and the multilayer-film mirror 1. Operational control of these components is provided by the controller 8.

During milling of a multilayer-film mirror using this embodiment, the amount of layer material actually removed is a function of various parameters including the acceleration voltage and/or beam current, the type of gas supplied to the ion source 12, the gas-flow rate, the vacuum level established inside the vacuum chamber 21, the distance between the ion source 12 and the surface of the multilayer film 1a, and the angle of incidence of the ions on the surface of the multilayer film 1a. As can be seen, most of the influential parameters relate to the operating parameters of the ion source 12. Consequently, these parameters are selected so that the amount of layer material actually removed is controlled accurately and precisely. By way of example, the ion-source parameters are selected so that Mo layers and Si layers can be milled accurately and precisely. Desirably, argon is used as the gas supplied by the gas supply 14a to the ion source 12.

A temperature-controlled platform 27 is situated inside the vacuum chamber 21 and serves as a platform to which the mirror 1 is mounted. The temperature of the multilayer-film mirror 1 is monitored, during milling, by a temperature sensor (not shown) such as an infrared sensor. Based on data produced by the temperature sensor, the temperature of the multilayer-film mirror 1 is controlled by appropriate adjustments to the temperature control of the platform 27 to avoid any undesirable changes in temperature of the mirror 1.

As a location on the surface of the multilayer film 1a is being milled, ions of the beam 25 are controlled to have a desired spatial distribution as incident on the mirror surface. The amount of layer material removed is a function of various factors including the time duration of ion irradiation. This time desirably is determined in advance from the rate at which the layer material is removed.

In a specific example in which a Mo/Si multilayer-film mirror 1 was milled using the apparatus of this embodiment, a milling accuracy of approximately 2 nm was achieved. Milling can be accomplished with this embodiment in less time than with the second representative. Also, measurements of the index of reflectivity obtained before and after milling revealed no significant change in the index after concluding milling compared to before commencing milling.

Fourth Representative Embodiment

Figure 4:
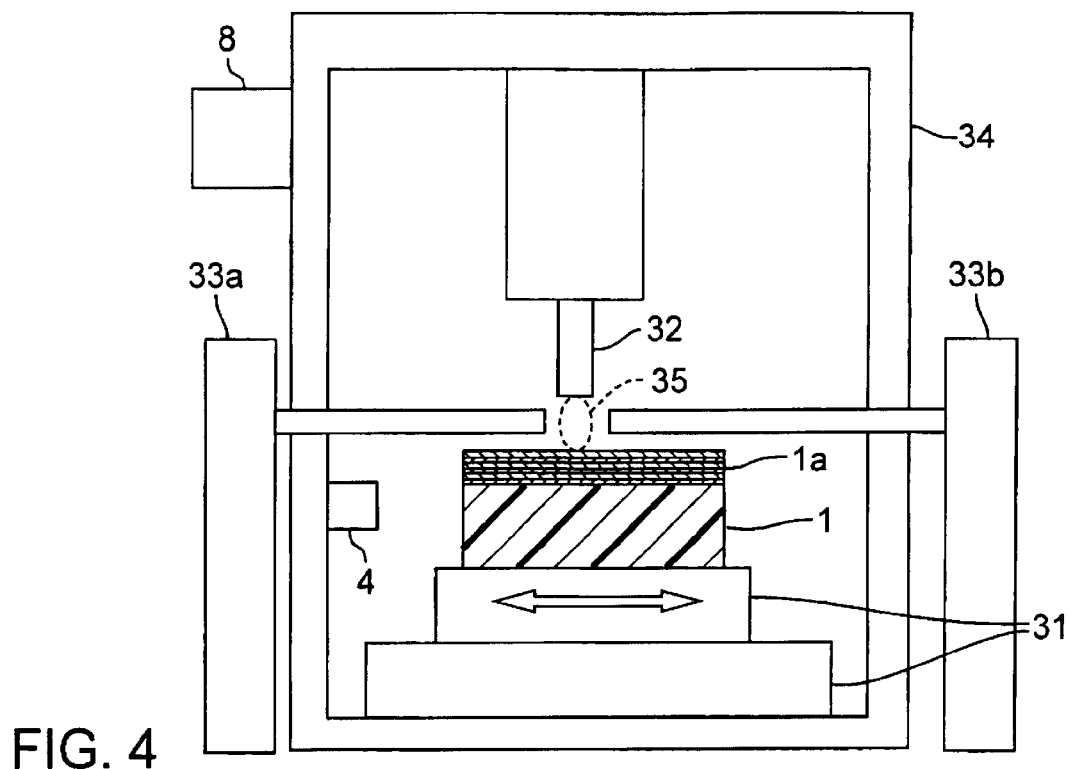
FIG. 4 is a schematic elevational diagram of a multilayer-film-milling device according to a fourth representative embodiment.

FIG. 4 schematically depicts a multilayer-film-milling device according to a fourth representative embodiment. In FIG. 4, components that are similar to respective components shown in FIG. 1 have the same respective reference numerals. The depicted device comprises a stage 31 that supports a multilayer-film mirror 1 comprising a multilayer film 1a. The device also includes a milling electrode 32, gas supplies 33a, 33b, a vacuum chamber 34, and a position detector 4 that detects the position of the multilayer-film mirror 1.

A voltage is impressed on the milling electrode 32 as the milling electrode is brought near the surface of the multilayer film 1a. Meanwhile a highly anionic gas, such as a halogen gas, is supplied by the gas supplies 33a, 33b. The voltage on the electrode 32 and the presence of molecules of the gas near the surface of the multilayer film 1a generate a plasma 35 at the tip of the milling electrode 32 adjacent the surface of the multilayer film 1a. The plasma generates free radicals from the molecules of gas. The radicals locally react with the material on the surface of the multilayer film 1a. The reactions produce volatile products. Thus, the surface of the multilayer film 1a immediately beneath the plasma 35 is eroded chemically. During milling, operational parameters of the milling electrode 32 are controlled by a controller 8. Since removal of surficial material from the multilayer film 1a is accomplished by chemical reaction with the free radicals in the plasma 35, local material removal can be achieved without causing any collateral damage to other regions of the multilayer film 1a.

A specified location on the surface of the multilayer film 1a can be milled with the aid of a non-contacting metal plate (not shown) placed adjacent the location while conducting milling at the location, using the plate as a mask. Specified locations also can be milled by forming a correspondingly patterned resist layer on the surface of the multilayer film 1a, which also serves as a mask.

The amount of layer material removed by this technique is a function of various parameters such as, but not limited to, the voltage impressed on and the type of gas supplied to the milling electrode 32, the gas-flow rate, the vacuum level established inside the vacuum chamber, the space between the milling electrode 32 and the surface of the multilayer film 1a, and the angle of the milling electrode relative to the surface of the multilayer film. These parameters are selected and controlled so as to achieve precise and accurate control of the amount of layer material actually removed. Optimal milling conditions differ depending upon the type of layer being milled (e.g., Mo or Si). Each layer can be milled at its own optimal parameters.

FIG. 4 shows two gas supplies 33a, 33b that supply that supply the respective optimal gases for milling particular respective layer materials. For example, a respective gas is supplied from the first gas supply 33a whenever a Mo layer is being milled, and a respective gas is supplied from the second gas supply 33b whenever a Si layer is being milled.

The stage 31 that supports the multilayer-film mirror 1 desirably is orthogonally movable in at least the X-Y or X-θ directions. The stage 31 is situated inside the vacuum chamber 34 and thus desirably is actuated by mechanisms that are operable in a vacuum. By moving the stage 31, the milling electrode 32 can be brought to any desired location on the surface of the multilayer film 1a. Actuation of the stage 31 is controlled by a controller 8. Thus, the controller 8 controls the locations and amounts of material removed from the surface of the multilayer film 1a. Alternatively or in addition to movement of the stage 31, the milling electrode can be provided with a mechanism (not shown) that achieves movement of the electrode relative to the mirror. The position of the multilayer-film mirror is detected by a position detector 4 in the manner described above.

When milling a location on the surface of a Mo/Si multilayer film 1a, first the topmost Si layer is processed under optimum conditions for milling Si. Then, after milling has progressed to the underlying Mo layer, milling conditions change to conditions optimal for milling Mo. This alternating scheme is repeated as required as milling progresses through the desired number of lamina sets of the multilayer film at the location.

In a specific example involving milling a Mo/Si multilayer-film mirror, this representative embodiment achieved a milling accuracy of approximately 0.5 nm. Measurements of the index of reflectivity performed before and after milling revealed no significant change.

Fifth Representative Embodiment

Figure 5:
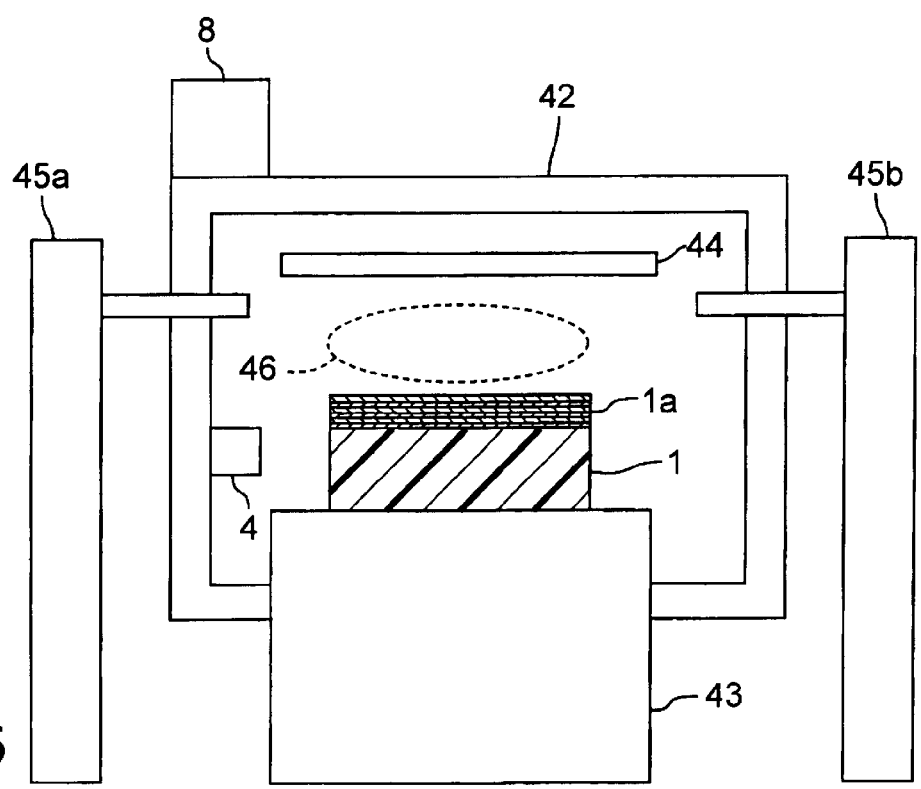
FIG. 5 is a schematic elevational diagram of a multilayer-film-milling device according to a fifth representative embodiment.

FIG. 5 schematically depicts a multilayer-film-milling device according to a fifth representative embodiment. In FIG. 5, components that are similar to respective components shown in FIG. 1 have the same respective reference numerals. The depicted device comprises a vacuum chamber 42 that is evacuated to a suitable vacuum level in which a multilayer-film mirror 1 comprising a multilayer film 1a is placed. The device also includes a high-frequency (e.g., RF) electrode 43, an opposing electrode 44, and gas supplies 45a, 45b.

This device removes multilayer-film material by supplying a reactive gas into the vacuum chamber 42 from a gas supply 45a, 45b while impressing a voltage on the high-frequency electrode 43. These conditions generate a plasma 46 between the multilayer-film mirror 1 and the opposing electrode 44. The plasma 46 produces free radicals of the introduced gas, yielding a localized chemical reaction on the surface of the multilayer film that results in removal of surficial material at one or more selected locations.

The amount of layer material removed during milling using this device is a function of parameters such as, but not limited to, the voltage impressed on and the type of gas supplied to the high-frequency electrode 43, the gas-flow rate, and the vacuum level established in the vacuum chamber 42. Respective values of these parameters are selected to achieve precise and accurate control of the amount of layer material removed. Since optimal milling conditions differ depending upon the type of layer material being milled (e.g., Mo or Si), each layer desirably is milled under conditions optimal for milling the particular material.

In the depicted device, two gas supplies 45a, 45b are provided to supply the optimal respective gas for the particular layer material being milled. For example, when milling a Mo/Si multilayer-film mirror 1, the gases can be selected for optimal milling of Mo and Si, respectively. A first gas is supplied from the first gas supply 45a whenever a Mo layer is being milled, and a second gas is supplied from the second gas supply whenever a Si layer is being milled. By way of example, the first gas for Mo desirably is a mixture of $CF_4$, Ar, and $O_2$, and the second gas for Si desirably is $SF_6$.

When removing layer material using this device, desirably those regions from which removal is not performed are covered with a mask so as to ensure fine control of the location(s) on the surface at which milling is to be performed. Using a mask, any location(s) on the surface of the multilayer film 1a can be milled. The mask desirably is a patterned layer of a resist. The manner of using a resist is discussed with reference to FIGS. 6(a)–6(f).

Figure 6A:
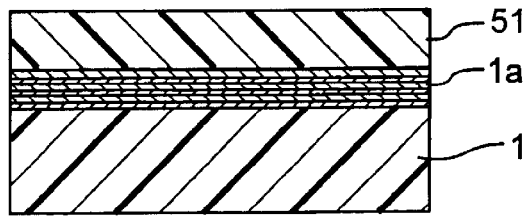
FIGS. 6(a)–6(f) depict the results of respective steps in a method, according to the fifth representative embodiment, in which a mask is used to perform milling at desired locations on the surface of the multilayer film, producing either a stepwise depth profile or a smoothly contoured depth profile of removed layers.
Figure 6B:
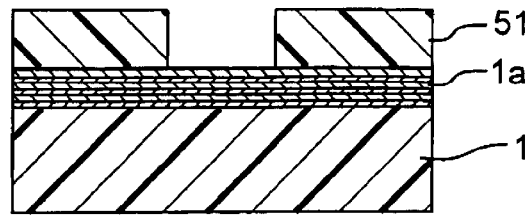

Turning first to FIG. 6(a), a resist 51 is applied to the entire surface of the multilayer film 1a. Next, as shown in FIG. 6(b), a selected region in the resist 51 is "exposed," preferably by microlithography. Namely, a light to which the resist is sensitive, such as ultraviolet light, is illuminated on the selected region of the resist, causing sensitized regions of the resist (or alternatively non-sensitized regions) to be rendered removable by a resist-development process.

Figure 6C:
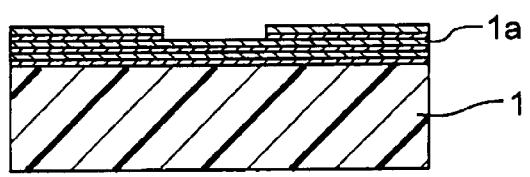

Next, from the selected location on the multilayer film 1a that is "exposed" by the resist, a desired amount of layer material is removed, which typically involves removal of multiple lamina sets from the location. I.e., only locations in which developed resist is absent are vulnerable to milling using the device of FIG. 5. The result of this step is shown in FIG. 6(c). Finally, the resist is stripped off using a stripping fluid or the like.

Figure 6D:
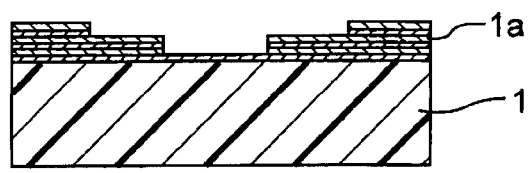
Figure 6E:
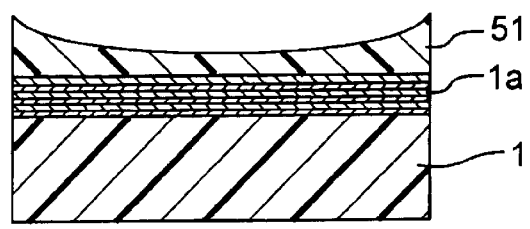

By repeating the above process (FIGS. 6(a)–6(c)) while changing the area of the surface of the multilayer film "exposed" by the resist, milling of the multilayer film can be performed with a desired stepwise depth distribution, as shown in FIG. 6(d). Thus, the amount of material removed at each location on the surface of the multilayer film can be controlled accurately and precisely.

In a variation of this method, the layer of resist 51 can be processed, after microlithographic exposure, to have a sectional profile having a shaped dictated by the exposure dose received at various points along the profile. The resulting profile of the resist has a smooth thickness contour rather than a stepwise thickness contour (FIG. 6(e)). To such end, the resist is exposed to a light to which the resist is sensitive, e.g., UV light. During exposure the exposure light flux has a desired intensity distribution causing a corresponding differential development of the resist. Desirably, light interference is exploited for obtaining the desired distribution of light intensity. For example, the lithographic light can be directed through an interference grid produced holographically, such as a computer-generated holograph (CGH).

Figure 6F:
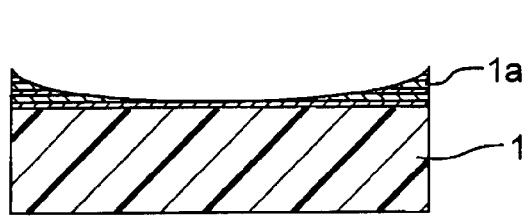

The smooth profile of the resist can be transferred to the multilayer film 1a by milling the surface of the multilayer film 1a using the device of this embodiment. The resist serves as the milling mask, which provides a corresponding distribution to the amount of material removed from the surface of the multilayer film 1a, as shown in FIG. 6(f). Thus, the amounts of layer material removed at various locations on the surface of the multilayer film 1a can be controlled to desired respective amounts.

With respect to an exemplary Mo/Si multilayer-film mirror, milling commences with the topmost silicon layer, of which milling is conducted under optimal milling conditions for Si. When milling has penetrated through the topmost Si layer, milling is conducted under optimal milling conditions for Mo, which are different from optimal conditions for Si. By repeating this scheme in an alternating manner, the desired number of layers is milled at the location.

Further with respect to the example, a Mo/Si multilayer-film mirror milled using the device of this embodiment exhibited a milling accuracy of approximately 2 nm. Milling of a defined number of layers was performed in less time than a corresponding milling performed with the second representative embodiment. After completion of milling, the index of reflectivity of the multilayer-film mirror exhibited no significant change from the index of reflectivity of the mirror before commencing milling.

The steps shown in FIGS. 6(a)–6(f) are not limited to use of the device of this representative embodiment. Similar results can be obtained using, for example, the device of the fourth representative embodiment (FIG. 5), or other milling device.

Sixth Representative Embodiment

Figure 7:
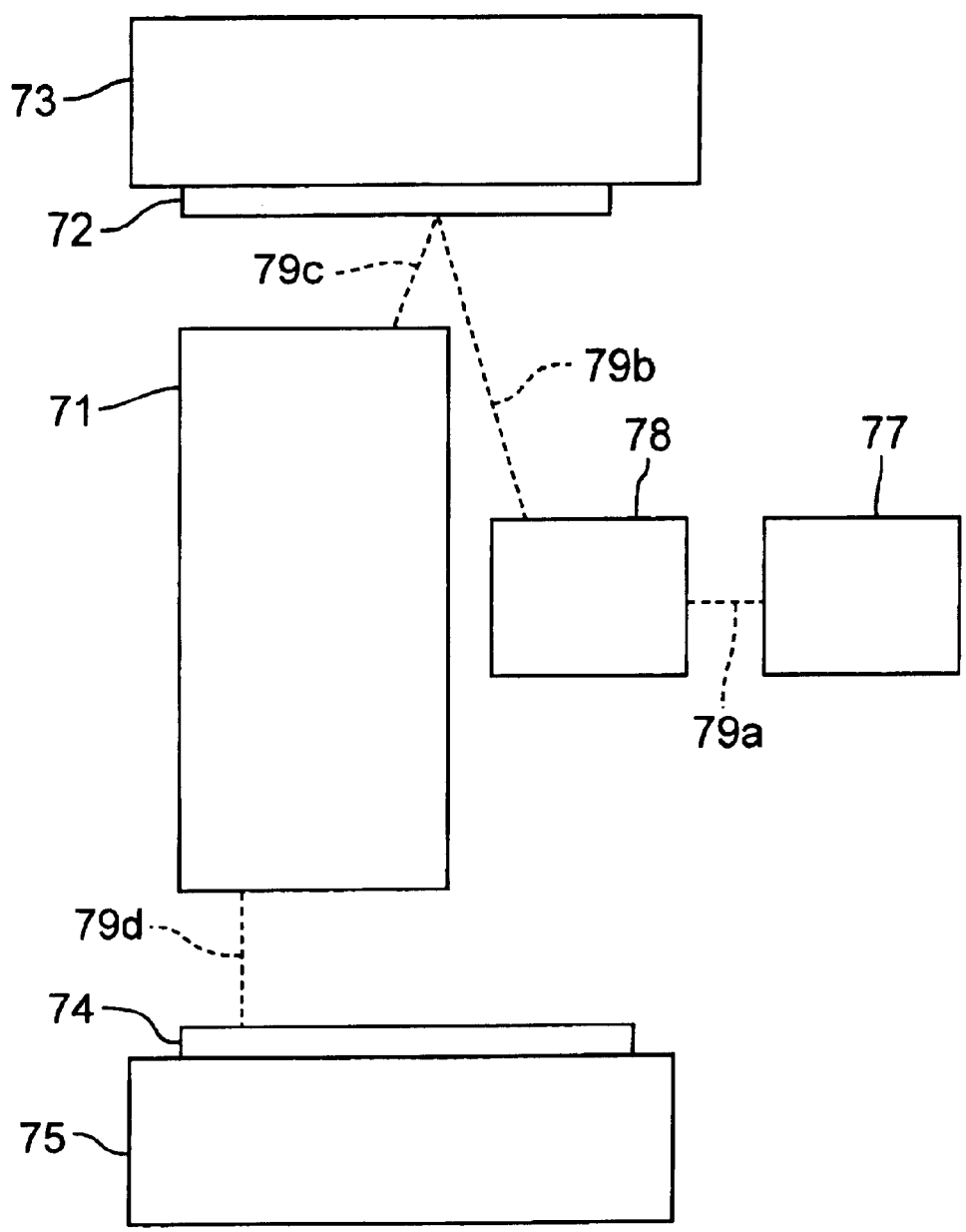
FIG. 7 is a schematic elevational diagram of an X-ray microlithography (exposure) apparatus according to a sixth representative embodiment, wherein the projection-optical system of the apparatus includes one or more multilayer-film mirrors that have been milled surficially as required to produce the lowest possible wavefront aberrations.

FIG. 7 is a schematic diagram of an embodiment of an X-ray microlithography ("exposure") apparatus according to this embodiment. This apparatus comprises at least one multilayer-film mirror that has been processed using any of the various embodiments of multilayer-film milling devices within the scope of the invention.

The microlithography apparatus comprises an X-ray source 77 that produces an X-ray "illumination beam" 79a. The apparatus includes an illumination-optical system 78 that directs the illumination beam 79b onto a reticle 72. The reticle 72 is an X-ray-reflective mirror that includes a surficial multilayer film on which a pattern has been defined. The X-ray beam 79c reflected from the reticle 72 is termed a "patterned beam" because it carries an aerial image of the region of the reticle 72 illuminated by the illumination beam 79b. The apparatus also includes a projection-optical system 71 that projects the patterned beam 79c onto the surface of a lithographic substrate 74 (e.g., a semiconductor wafer) coated with a suitable resist. Thus, the resist is exposed with the aerial image and becomes imprinted with the corresponding reticle pattern. The reticle 72 is mounted on a reticle stage 73, and the substrate is mounted on a substrate stage 75.

The X-ray source can be any of various suitable X-ray sources, such as a laser-plasma X-ray source, which is suitable for generating SXR radiation (having a wavelength of, e.g., 13.4 nm). The multilayer film on the reticle 72 is especially suitable for reflecting an illumination beam of a particular wavelength. In a specific example, the projection-optical system 71 is constructed with six multilayer-film mirrors, has a magnification factor of ⅕, and an annular exposure field having a width of 2 mm and a length of 30 mm. The six mirrors are supported inside a mirror column made, e.g., of Invar or other suitable material that is resistant to thermal distortion. Each of the six mirrors has an aspherical reflective surface coated with a Mo/Si multilayer film sufficient to achieve maximal X-ray reflectivity. One or more of the multilayer-film mirrors has a multilayer film corrected using a milling device such as any of the specific embodiments described above. As a result, the wavefront aberration of the projection-optical system 71 is exceptionally well corrected, to 0.5 nm RMS.

During exposure, the reticle 72 and substrate 74 are mounted to and scanned by their respective stages 73, 75. The substrate-scanning velocity is synchronized at ⅕ the scanning velocity of the reticle, according to the ⅕ demagnification factor of the projection-optical system 71.

The apparatus of FIG. 7 achieved an exposure resolution of 0.05 $\mu$m of various pattern elements as exposed within an exposure field corresponding to an entire "chip" on the substrate.

Whereas the invention has been described in connection with multiple representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. A multilayer-film mirror, comprising:
   a mirror substrate; and
   a multilayer film formed on a surface of the mirror substrate by alternatingly laminating multiple layers of at least two types of substances having different respective refractive indices, the layers being grouped into lamina sets having a specified period length, the multilayer film including a removed portion at a selected location at which at least one lamina set is removed to control phase shift in a reflected wavefront from the multilayer film, the removed portion having a predetermined depthwise gradation with respect to amount of layer material removed.

2. An X-ray optical system, comprising at least one multilayer-film mirror as recited in claim 1.

3. An X-ray exposure apparatus, comprising an X-ray optical system as recited in claim 2.

4. An X-ray exposure apparatus, comprising:

an X-ray source that generates an X-ray beam;

an illumination-optical system that guides the X-ray beam from the X-ray source to a reticle that defines a pattern; and a projection-optical system that guides the X-ray beam from the reticle to a lithographic substrate coated with a resist, so as to transfer the pattern from the reticle to the substrate, the exposure apparatus including at least one multilayer-film mirror as recited in claim 1.

5. The X-ray exposure apparatus of claim 4, wherein the at least one multilayer-film mirror is situated in at least one of the illumination-optical system, the projection-optical system, and the reticle.

* * * * *

UNITED STATES PATENT AND TRADEMARK OFFICE
CERTIFICATE OF CORRECTION

PATENT NO. : 6,909,774 B2
DATED : June 21, 2005
INVENTOR(S) : Oshino et al.

It is certified that error appears in the above-identified patent and that said Letters Patent is hereby corrected as shown below:

Column 6,
Line 46, "can comprises" should be -- can comprise --.

Column 7,
Line 32, "removal one" should be -- removal to one --.

Column 15,
Lines 51-52, "that supply that supply" should be -- that supply --.

Signed and Sealed this

Twenty-ninth Day of November, 2005

JON W. DUDAS
*Director of the United States Patent and Trademark Office*